(12) United States Patent
Cao et al.

(10) Patent No.: US 11,894,394 B2
(45) Date of Patent: Feb. 6, 2024

(54) ARRAY SUBSTRATE, METHOD FOR PREPARING ARRAY SUBSTRATE, AND BACKLIGHT MODULE

(71) Applicant: BOE Technology Group Co., Ltd., Beijing (CN)

(72) Inventors: Zhanfeng Cao, Beijing (CN); Yingwei Liu, Beijing (CN); Ke Wang, Beijing (CN); Guocai Zhang, Beijing (CN); Jianguo Wang, Beijing (CN); Zhiwei Liang, Beijing (CN); Haixu Li, Beijing (CN); Muxin Di, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 481 days.

(21) Appl. No.: 17/281,015

(22) PCT Filed: Jan. 3, 2020

(86) PCT No.: PCT/CN2020/070325
§ 371 (c)(1),
(2) Date: Mar. 29, 2021

(87) PCT Pub. No.: WO2021/134794
PCT Pub. Date: Jul. 8, 2021

(65) Prior Publication Data
US 2022/0123024 A1 Apr. 21, 2022

(51) Int. Cl.
*H01L 27/12* (2006.01)
*H01L 27/15* (2006.01)
(Continued)

(52) U.S. Cl.
CPC ............ *H01L 27/124* (2013.01); *C25D 7/123* (2013.01); *C25D 17/007* (2013.01); *H01L 27/127* (2013.01); *H01L 27/156* (2013.01)

(58) Field of Classification Search
CPC ..... H01L 27/124; H01L 27/127; C25D 7/123; C25D 17/007; G02F 1/133603
See application file for complete search history.

(56) References Cited

U.S. PATENT DOCUMENTS

2008/0011610 A1   1/2008   Katou et al.
2016/0215409 A1   7/2016   Wilson et al.
(Continued)

FOREIGN PATENT DOCUMENTS

CN   101096770 A   1/2008
CN   106997888 A   8/2017
(Continued)

OTHER PUBLICATIONS

European Search Report for EP 20866923.4 dated Dec. 7, 2022.

*Primary Examiner* — David Vu
*Assistant Examiner* — Brandon C Fox
(74) *Attorney, Agent, or Firm* — ArentFox Schiff LLP; Michael Fainberg

(57) ABSTRACT

An array substrate, a method for preparing the array substrate, and a backlight module are disclosed. Before electroplating a first metal layer on a pattern of a seed layer, the method further includes: forming a pattern of a compensation electrode wire electrically connected with a lead electrode on a side, where the lead electrode is formed, of a base substrate. The compensation electrode wire is at least on a second side of a wiring region, the pattern of the lead electrode is formed at a first side of the wiring region, and the first side and the second side are different sides. In the electroplating process, the lead electrode is connected with a negative pole of a power supply, the compensation electrode wire is electrically connected with the lead electrode, (Continued)

thus an area of an electroplating negative pole generating electric field lines is increased by utilizing the compensation electrode wire.

12 Claims, 12 Drawing Sheets

(51) Int. Cl.
*C25D 7/12* (2006.01)
*C25D 17/00* (2006.01)

(56) References Cited

U.S. PATENT DOCUMENTS

2020/0035147 A1  1/2020  Ban et al.
2022/0018036 A1*  1/2022  Banik, II ............... C25D 5/605

FOREIGN PATENT DOCUMENTS

| CN | 109031779 | A | 12/2018 |
| CN | 110402034 | A | 11/2019 |
| CN | 110632796 | A | 12/2019 |
| WO | 2019127676 | A1 | 7/2019 |

* cited by examiner

ARRAY SUBSTRATE, METHOD FOR PREPARING ARRAY SUBSTRATE, AND BACKLIGHT MODULE

CROSS REFERENCE TO RELATED APPLICATIONS

This application is a national phase entry under 35 U.S.C. § 371 of International Application No. PCT/CN2020/070325, filed on Jan. 3, 2020, the entire content of which is incorporated herein by reference.

FIELD

The present disclosure relates to the technical field of semiconductors, in particular to an array substrate, a method for preparing the array substrate, and a backlight module.

BACKGROUND

Currently, the most direct and effective method in the aspect of promoting the contrast of a liquid crystal display is that partitioning control is carried out on backlight of the liquid crystal display, and the contrast of the liquid crystal display is promoted to over 100,000:1. In the related arts, when backlight partitioning control is carried out, generally, a circuit of a Mini Light-Emitting Diode (LED) is prepared on a Printed Circuit Board (PCB), thus the cost is high and the display is large in thickness. In view of this, a new method needs to be found for replacing the existing method. For this reason, a technology of preparing a Mini LED backlight module on a glass substrate emerges. The Mini LED has a high current in an on state, and thus, a relatively thick Cu (copper) wire needs to be prepared on the glass substrate. Cu with the specification of over 1 micron cannot be prepared by a common sputtering process due to the stress, and thus, the Cu needs to be prepared by adopting an electroplating process. The glass substrate used by a panel factory is large in size, and thus, the electroplated copper is poor in uniformity, resulting in that the wire resistance is poor in uniformity and light-emitting uniformity is influenced.

SUMMARY

Embodiments of the present disclosure provide an array substrate, a method for preparing the array substrate, and a backlight module. The solutions are as follows.

Embodiments of the present disclosure provide a method for preparing an array substrate, including:

forming a pattern of a seed layer in a wiring region of a base substrate;

forming a pattern of a lead electrode at a first side of the wiring region, the lead electrode being electrically connected with the seed layer;

forming a pattern of a blocking dam on a side, where the pattern of the seed layer is formed, of the base substrate, the pattern of the seed layer being complementary with the pattern of the blocking dam; and electroplating a pattern of a first metal layer on the pattern of the seed layer, and when electroplating the pattern of the first metal layer, connecting the lead electrode with a negative pole of a power supply.

Before electroplating the pattern of the first metal layer on the pattern of the seed layer, the method further includes:

forming a pattern of a compensation electrode wire electrically connected with the lead electrode on a side, where the lead electrode is formed, of the base substrate.

The compensation electrode wire is at least at a second side of the wiring region, and the first side and the second side are different sides of the wiring region.

In some embodiments of the present disclosure, the pattern of the seed layer and the pattern of the lead electrode are formed by adopting a one-time patterning process.

In some other embodiments of the present disclosure, the pattern of the compensation electrode wire is formed when the pattern of the seed layer is formed.

In some other embodiments of the present disclosure, the pattern of the compensation electrode wire is formed when the pattern of the lead electrode is formed.

In some embodiments of the present disclosure, the lead electrode is provided with a plurality of hollow regions.

In some embodiments of the present disclosure, the compensation electrode wire and the lead electrode are distributed in a mode of surrounding the wiring region.

In some embodiments of the present disclosure, the compensation electrode wire is provided with a plurality of hollow regions.

In some embodiments of the present disclosure, at least a material of a surface of the seed layer is the same as a material of the first metal layer.

In some embodiments of the present disclosure, the material of the first metal layer is copper.

In some embodiments of the present disclosure, the seed layer includes: molybdenum and copper located sequentially on the base substrate; or, molybdenum alloy and copper located sequentially on the base substrate; or titanium and copper located sequentially on the base substrate.

In some embodiments of the present disclosure, after electroplating the pattern of the first metal layer on the pattern of the seed layer, the method further includes:

forming a planarization layer covering the pattern of the first metal layer;

forming a pattern of a connection wire on the planarization layer; and binding an array of LEDs on the connection wire, and electrically connecting the LEDs with the first metal layer by the connection wire.

In some embodiments of the present disclosure, after binding the array of LEDs, the method further includes:

removing the pattern of the compensation electrode wire and the pattern of the lead electrode.

Correspondingly, embodiments of the present disclosure further provide an array substrate. The array substrate is prepared by adopting the method provided by the embodiments of the present disclosure.

Correspondingly, embodiments of the present disclosure further provide a backlight module, including a backlight driving circuit and any one of the array substrates provided by the embodiments of the present disclosure.

DETAILED DESCRIPTION OF THE EMBODIMENTS

An electroplating process refers to a surface processing method that in salt solution containing pre-plated metal, to-be-plated base metal is used as a negative pole, coated metal or other insoluble materials are used as a positive pole, and by electrolysis, positive ions of the pre-plated metal in electroplating liquid are reduced and deposited on the surface of a to-be-plated base to form a cladding.

Figure 1:
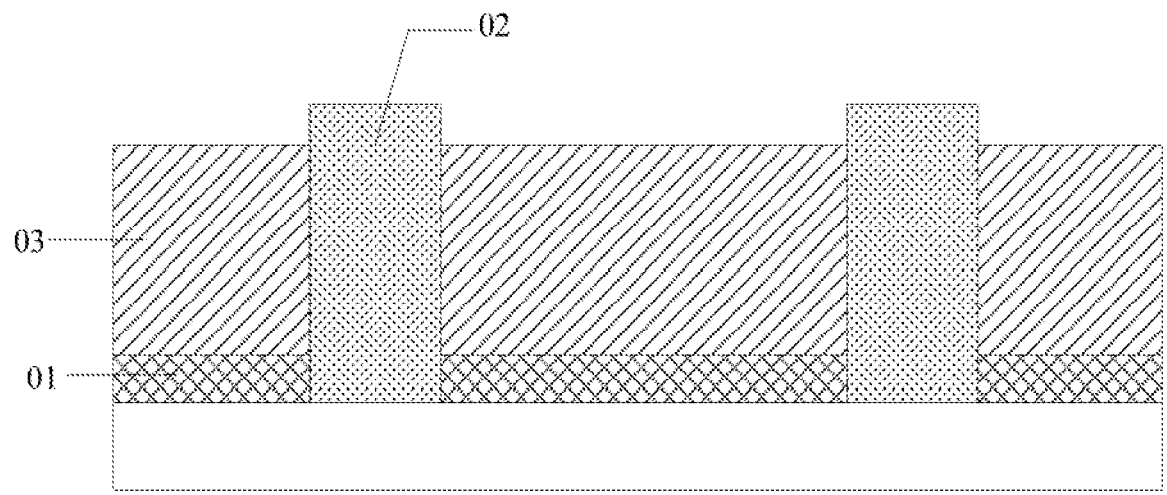
FIG. 1 is a structural schematic diagram obtained by preparing copper with a first electroplating method in the related arts.
Figure 2:
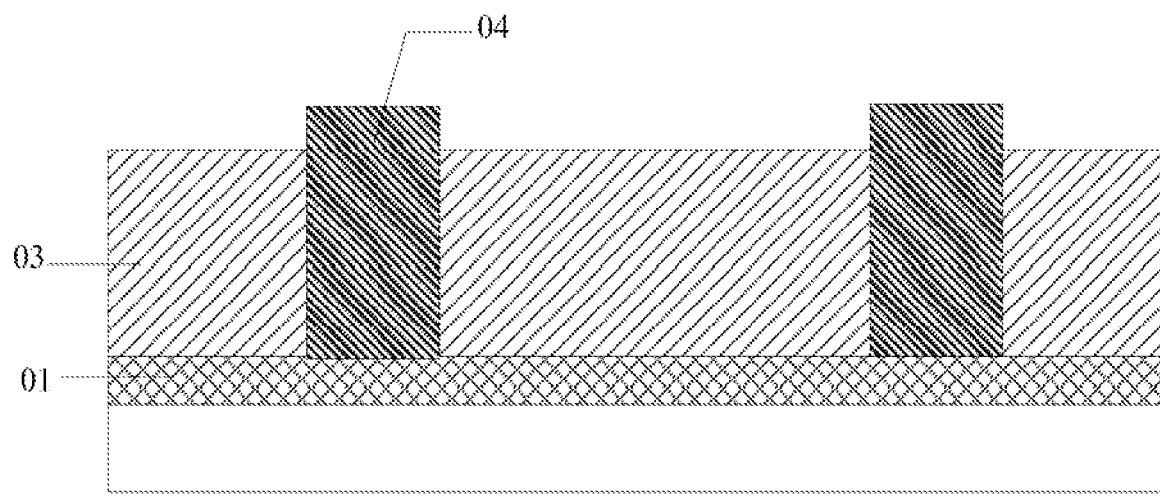
FIG. 2 is a structural schematic diagram obtained by preparing copper with a second electroplating method in the related arts.
Figure 3:
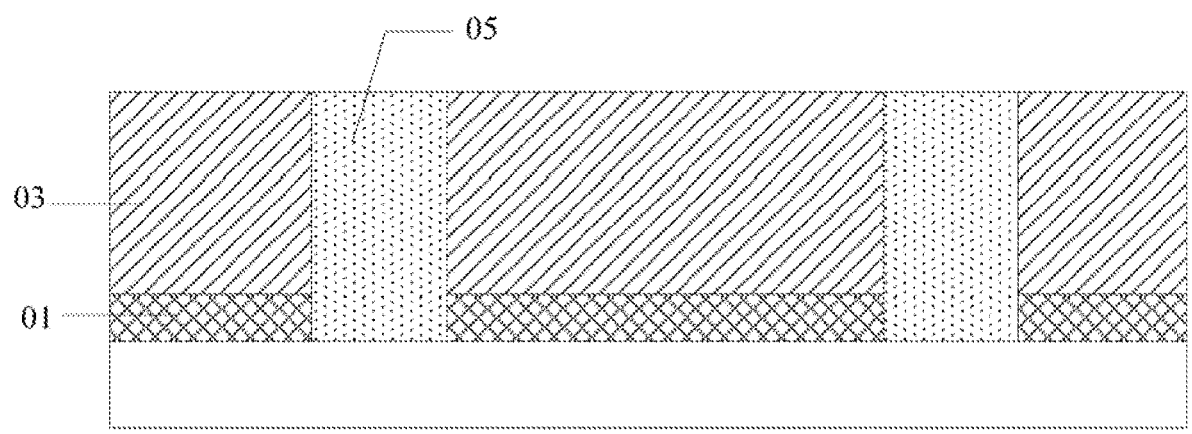
FIG. 3 is a structural schematic diagram obtained by preparing copper with the second electroplating method in the related arts.
Figure 4:
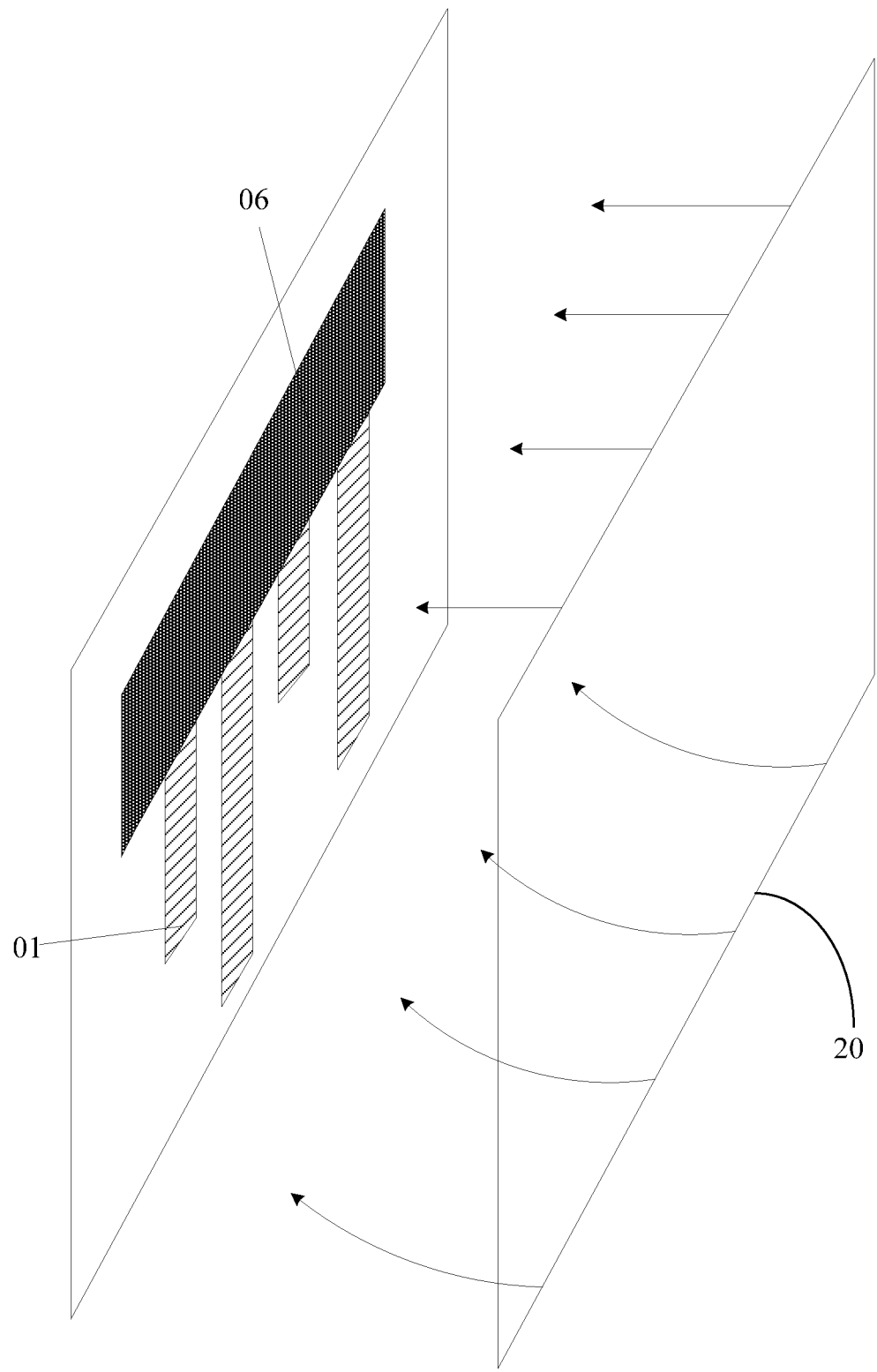
FIG. 4 is a schematic diagram of distribution of electric field lines in the electroplating process in a first electroplating method.

In the related art, there are mainly two copper electroplating methods. According to a first electroplating method, as shown in FIG. 1, firstly, a seed layer 01 is deposited and patterned, then a pattern of a large-thickness blocking dam 02 is formed, and then electroplating is carried out to form a copper pattern 03. According to a second electroplating method, as shown in FIG. 2, firstly, a whole-surface seed layer 01 is deposited, then a patterned resin layer 04 is formed, and then a copper pattern 03 is formed by electroplating. The seed layer 01 generally is a conducting material, and thus, in order to avoid needless electrical connection between the copper patterns 03, as shown in FIG. 3, the resin layer 04 and the seed layer 01 positioned below the resin layer 04 need to be removed later, and a planarization layer 05 is formed at a corresponding position. In the two methods, the second method is good in electroplating uniformity due to use of the whole-surface seed layer for electroplating, but a portion between the adjacent copper patterns 03 needs to be planarized later, and thus, high segment difference planarization is a big difficult problem, and repeated patterning may need to be carried out for leveling up, resulting in high cost. The first method is low in cost due to no requirement for planarization. However, in the first method, electroplating is carried out by the patterned seed layers, in an electroplating process, as shown in FIG. 4, the seed layers 01 can only be converged to one side of a wiring region to be connected with a lead electrode 06, and the seed layers 01 are different in length and uneven in distribution, resulting in that electric field distribution between a negative pole (the seed layer) of an electroplated product and an electroplating positive pole 20 (the positive pole is a Cu ball or an insoluble positive pole) in an electroplating bath is uneven, even though the electroplating liquid is stirred, metal ions driven by an electric field to move to the negative pole still cannot be thickly and uniformly deposited, and an edge effect is liable to generate outside the negative pole opposite to the electroplating positive pole 20 due to centralized power lines, further resulting in poor uniformity of an thickness of the electroplated copper. In FIG. 4, a left block represents a substrate on which a pattern of the deposited seed layer 01 is prepared, and a right block represents the electroplating positive pole 20 which is applied with a different polarity potential from that applied to the seed layer on the substrate after powering-up and forms the electric field with the seed layer.

In view of this, embodiments of the present disclosure provide an array substrate and a method for preparing the array substrate, and a backlight module in order to improve uniformity of electroplated metal on the basis of not sharply increasing cost.

In order to enable objects, characteristics and advantages of the present disclosure to be more apparent and understandable, the present disclosure will be further illustrated below in connection with the drawings and the embodiments. However, exemplary embodiments can be implemented in various forms, and should not be understood to be limited to the embodiments illustrated herein; and on the contrary, providing those embodiments makes the present disclosure more comprehensive and full and comprehensively conveys the concept of the exemplary embodiments to those skilled in the art. In the drawings, the same reference signs represent the same or similar structures, and thus, their repeated descriptions will be omitted. In the present disclosure, described words expressing positions and directions are all illustrations carried out by taking the drawings as examples, but can also be changed as required, and all the made changes should fall within the scope of protection of the present disclosure. The drawings of the present disclosure are merely used for indicating relative position relationships, but do not represent a true scale.

It should be illustrated that the specific details are illustrated in the following description in order to sufficiently understand the present disclosure. However, the present disclosure can be implemented in various other modes different from descriptions herein, and those skilled in the art can make similar popularization without departure from connotation of the present disclosure. Therefore, the present disclosure is not limited to the specific embodiments disclosed below. The subsequent description of the specification is the preferred embodiment of implementing the application, but aims to illustrate the general principle of the application and is not intended to limit the scope of the application. The scope of protection of the application is determined by the appended claims.

The array substrate, the method for preparing the array substrate, and the backlight module which are provided by the embodiments of the present disclosure will be specifically illustrated below in connection with the drawings.

Figure 5:
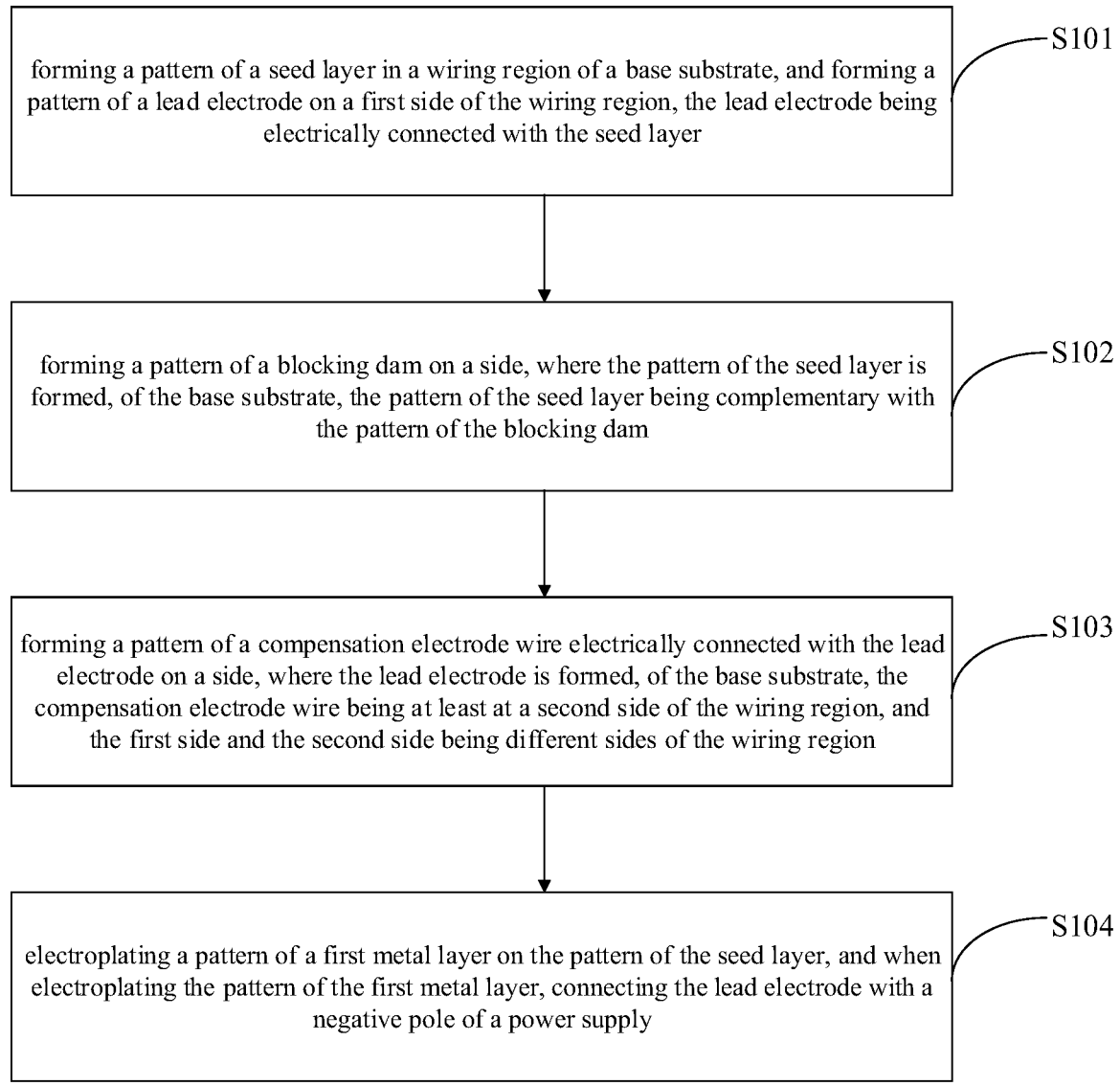
FIG. 5 is a flow chart of a method for preparing an array substrate provided by an embodiment of the present disclosure.

A method for preparing an array substrate, which is provided by an embodiment of the present disclosure, as shown in FIG. 5, includes operations S101 to S104.

S101: a pattern of a seed layer is formed in a wiring region of a base substrate, and a pattern of a lead electrode is formed at a first side of the wiring region, and the lead electrode is electrically connected with the seed layer.

S102: a pattern of a blocking dam is formed on a side, where the pattern of the seed layer is formed, of the base substrate, and the pattern of the seed layer is complementary with the pattern of the blocking dam.

S104: a pattern of a first metal layer is electroplated on the pattern of the seed layer, and when the pattern of the first metal layer is electroplated, the lead electrode is connected with a negative pole of a power supply. Before operation S104 of electroplating the pattern of the first metal layer on the pattern of the seed layer, the preparation method further includes operation S103.

S103: a pattern of a compensation electrode wire electrically connected with the lead electrode is formed on a side, where the lead electrode is formed, of the base substrate, and the compensation electrode wire is at least positioned at a second side of the wiring region, and the first side and the second side are different sides of the wiring region.

Figure 6:
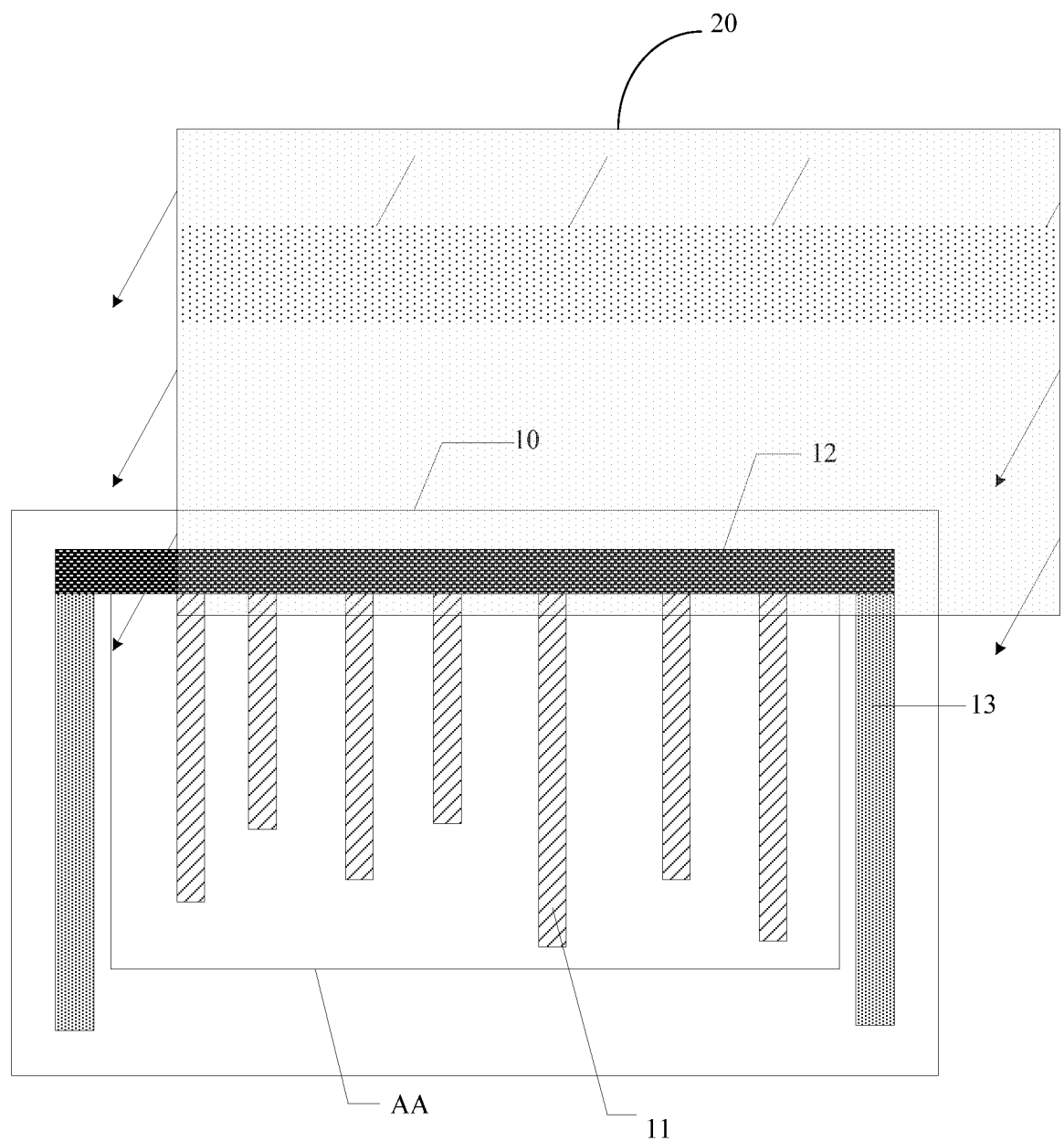
FIG. 6 is a schematic diagram of electric field lines in the electroplating process in a method for preparing an array substrate provided by an embodiment of the present disclosure.

The method for preparing the array substrate provided by embodiments of the present disclosure, before the operation of electroplating the pattern of the first metal layer on the pattern of the seed layer, further includes: forming the pattern of the compensation electrode wire electrically connected with the lead electrode on a side, where the lead electrode is formed, of the base substrate. The compensation electrode wire is at least at the second side of the wiring region, and the first side and the second side are different sides of the wiring region. In the electroplating process, as shown in FIG. 6, the lead electrode 12 is connected with the negative pole of the power supply. The compensation electrode wire 13 is electrically connected with the lead electrode 12, so that an electroplating negative pole is composed of the seed layer 11, the lead electrode 12 and the compensation electrode wire 13, i.e., equivalently, an area of the electroplating negative pole generating electric field lines is increased by utilizing the compensation electrode wire 13, and the uniform electric field lines at the edge of the wiring region AA are increased to expand an edge region of electroplating out of the wiring region AA so as to improve distribution of the electric field lines in the wiring region AA and improve electroplating uniformity.

Figure 7A:
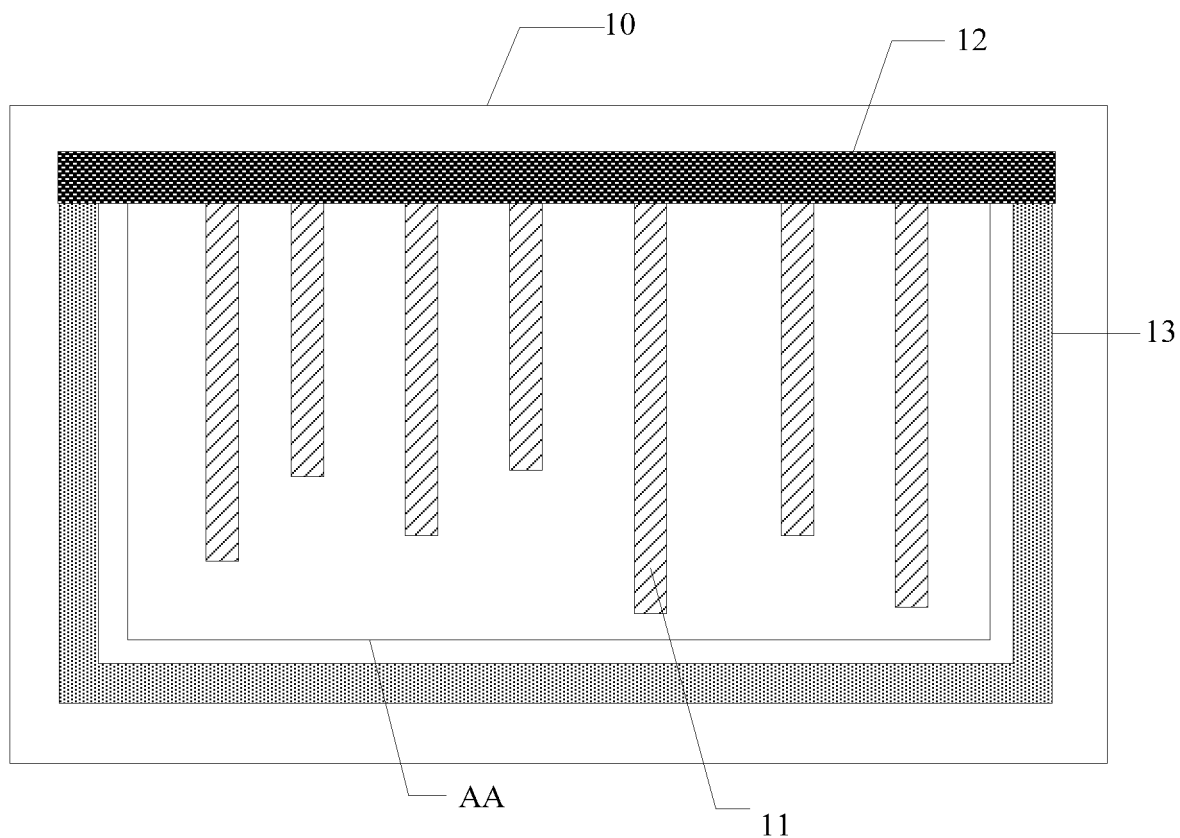
FIG. 7A is a structural schematic diagram of a compensation electrode wire provided by an embodiment of the present disclosure.
Figure 7B:
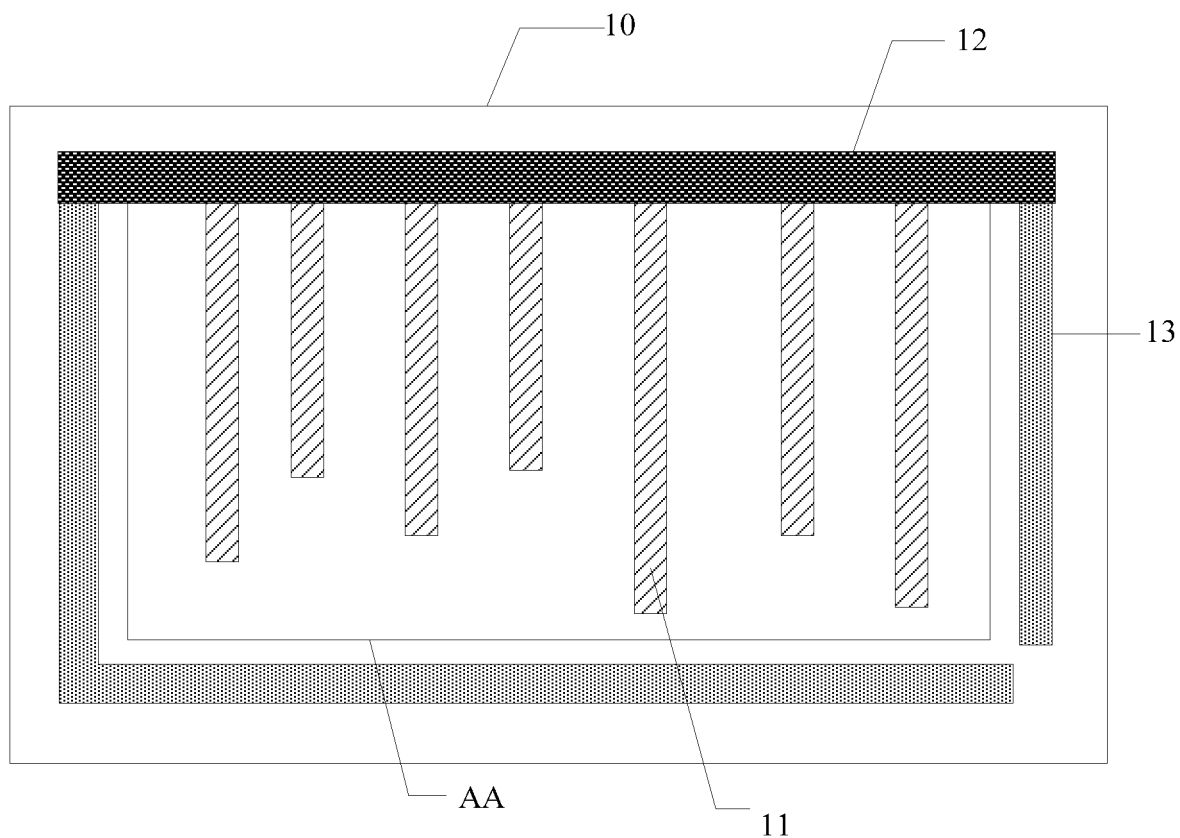
FIG. 7B is a structural schematic diagram of a compensation electrode wire provided by another embodiment of the present disclosure.

In the method for preparing an array substrate provided by embodiments of the present disclosure, the greater a length of the compensation electrode wire surrounding the wiring region is, the more uniform distribution of the electric field lines in the wiring region is in the electroplating process. Therefore, in some embodiments, in the method for preparing an array substrate provided by embodiments of the present disclosure, as shown in FIG. 7A and FIG. 7B, the compensation electrode wire 13 and the lead electrode 12 are distributed in a mode of surrounding the wiring region AA. Therefore, it is guaranteed that there is the electroplating negative pole at each edge of the wiring region AA in the electroplating process so as to improve uniformity of distribution of the electric field lines in the wiring region AA, thereby improving electroplating uniformity.

In some embodiments, as shown in FIG. 7A, the compensation electrode wire 13 may be an integral pattern surrounding the wiring region AA and being of a half-frame structure; and as shown in FIG. 7B, the compensation electrode wire 13 may also be a pattern surrounding the wiring region AA and including a plurality of sub-structures at the same potential with the lead electrode 12.

In some embodiments, according to the method for preparing an array substrate provided by embodiments of the present disclosure, it only needs to be guaranteed that operation S103 is executed before operation S104, and a sequence of operation S103 with respect to operation S101 and operation S102 is not specifically limited herein. For example, operation S103 may be executed before operation S101, may be executed between operation S101 and operation S102, may be executed after operation S102, or may be carried out simultaneously with operation S101 or operation S102.

It should be illustrated that in the method for preparing an array substrate provided by embodiments of the present disclosure, complementation between the pattern of the seed layer and the pattern of the blocking dam refers to superposition of adjacent boundaries of the seed layer and the blocking dam. Namely, the pattern of the seed layer and the pattern of the blocking dam are superposed to cover the wiring region together.

In some embodiments, in the electroplating process, the seed layer serving as a negative pole is connected with the negative pole of the power supply by the lead electrode, an electroplating positive pole is a Cu ball or an insoluble positive pole and is connected with the power supply, and electroplating liquid is full filled between the negative pole and the positive pole, so that when the power supply is powered up, an electric field can be generated between the negative pole and the positive pole.

In some embodiments, in the method for preparing an array substrate provided by embodiments of the present disclosure, a material of the seed layer is a metal material. In order to improve a binding force between the first metal layer and the seed layer, at least a material of a surface of the seed layer is the same as the material of the first metal layer, i.e., due to the same property of the same material, the binding force is relatively large.

In some embodiments, due to low resistance of copper, generally, an electrode wire is prepared by adopting the copper. Therefore, in some embodiments, according to the method for preparing an array substrate provided by embodiments of the present disclosure, the material of the first metal layer is the copper. In some other embodiments, the first metal layer may also be other metal, which is not limited herein.

Further, in the method provided by embodiments of the present disclosure, when the material of the first metal layer is the copper, in order to increase an adhesive force between the seed layer and the base substrate, the seed layer includes molybdenum and copper sequentially positioned on the base substrate, or molybdenum alloy and copper sequentially positioned on the base substrate, or titanium and copper sequentially positioned on the base substrate. The molybdenum, the titanium or the molybdenum alloy close to the base substrate is used for increasing the adhesive force between the seed layer and the base substrate, and the copper close to the first metal layer is used for increasing the binding force between the seed layer and the first metal layer.

In some embodiments, in the method provided by embodiments of the present disclosure, the pattern of the seed layer and the pattern of the lead electrode are formed by adopting a one-time patterning process, i.e., during preparing the pattern of the seed layer, one whole seed layer film is formed, the film is patterned, and the pattern of the seed layer and the pattern of the lead electrode are simultaneously formed, so that one time of patterning process can be reduced, thereby reducing the production cost.

In some embodiments, in the method provided by embodiments of the present disclosure, when the pattern of the seed layer is formed, the pattern of the compensation electrode wire is formed, i.e., firstly, one whole conducting material film is formed, the film is patterned, and by a patterning process, the pattern of the seed layer and the pattern of the compensation electrode wire are simultaneously formed, so that one time of patterning process can be reduced, thereby improving the production efficiency and reducing the production cost.

In some embodiments, in the method provided by embodiments of the present disclosure, the pattern of the compensation electrode wire can also be formed when the pattern of the lead electrode is formed, i.e., one whole conducting material film is formed, the film is patterned, and the pattern of the lead electrode and the pattern of the compensation electrode wire are simultaneously formed, so that one time of patterning process can be reduced, thereby improving the production efficiency and reducing the production cost.

In some embodiments, in the method provided by embodiments of the present disclosure, the pattern of the seed layer, the pattern of the lead electrode and the pattern of the compensation electrode wire are simultaneously formed by adopting the one-time patterning process.

Figure 8:
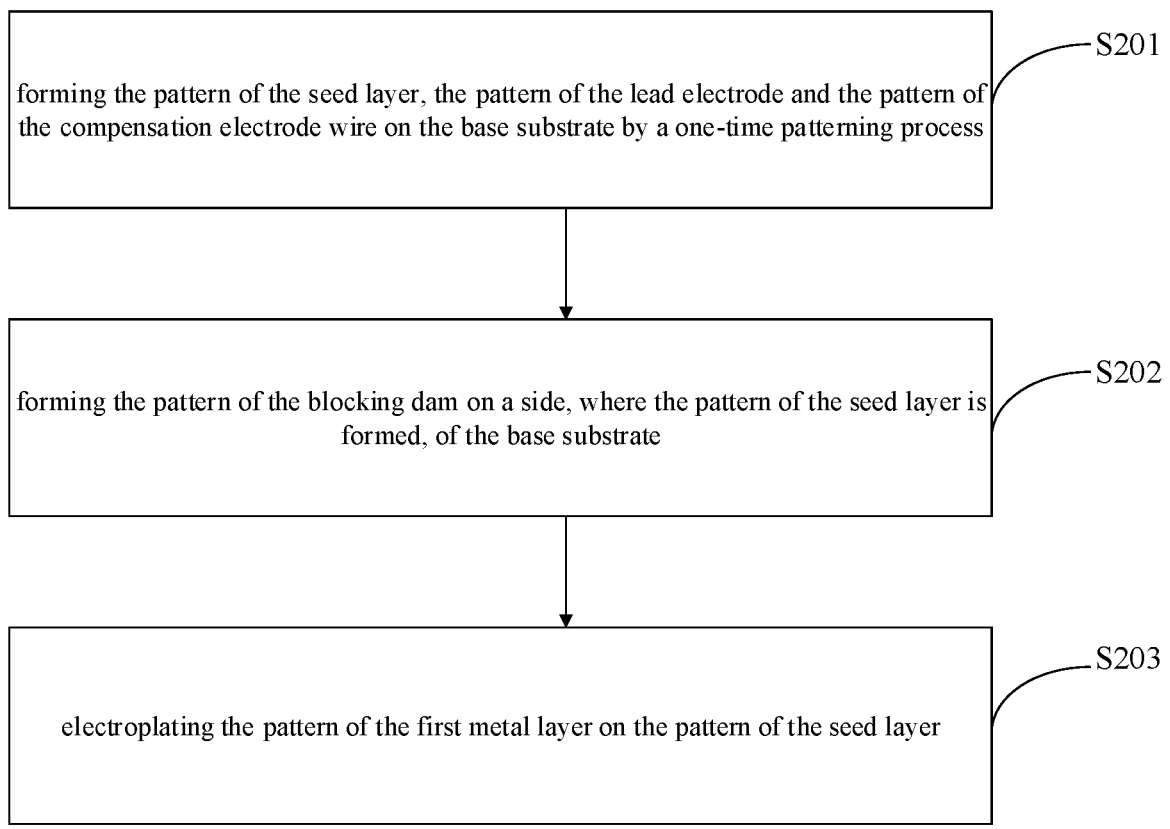
FIG. 8 is a flow chart of a method for preparing an array substrate provided by another embodiment of the present disclosure.

Preparation of each film in the method provided by the present disclosure will be illustrated in detail below by an embodiment. As shown in FIG. 8, the method includes operations S201 to operation S203.

Figure 9A:
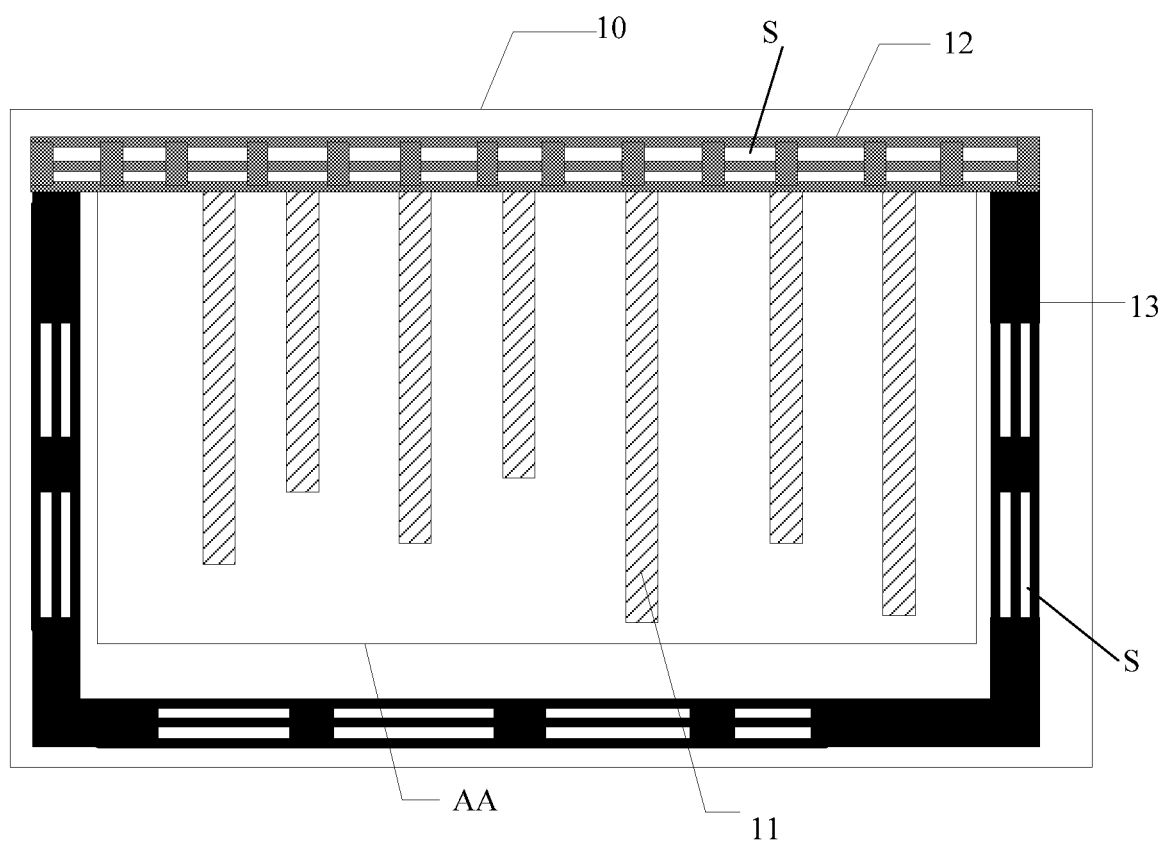
FIG. 9A is a structural schematic diagram obtained after operation S201 is executed in a method for preparing an array substrate provided by an embodiment of the present disclosure.

S201: the pattern of the seed layer 11, the pattern of the lead electrode 12 and the pattern of the compensation electrode wire 13 are formed on the base substrate 10 by the one-time patterning process, as shown in FIG. 9A.

In some embodiments, the material of the seed layer may be molybdenum/copper or molybdenum alloy/copper. The seed layer generally is formed in a sputtering mode, which is not limited herein.

Further, the thickness of the seed layer generally is between 0.3 micron and 1 micron, which is not limited herein.

Figure 9B:
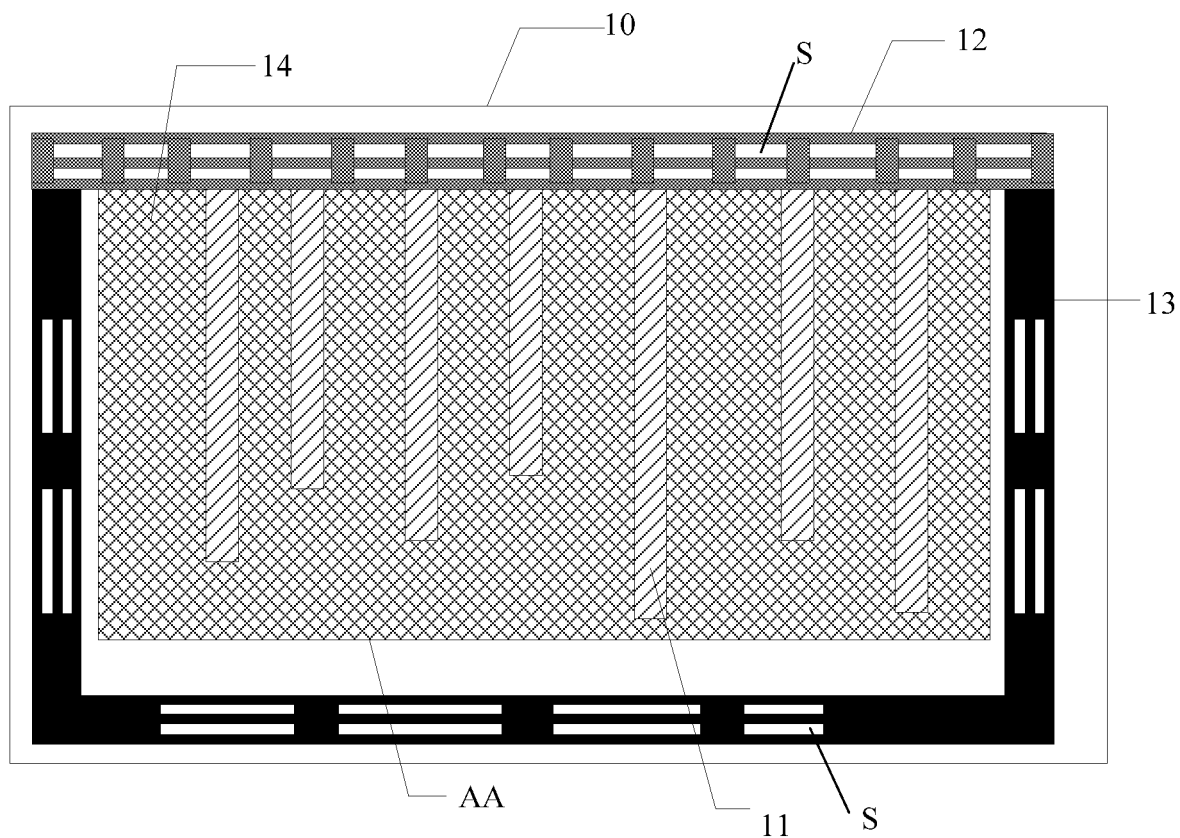
FIG. 9B is a structural schematic diagram obtained after operation S202 is executed in a method for preparing an array substrate provided by an embodiment of the present disclosure.

S202: the pattern of the blocking dam 14 is formed on a side, where the pattern of the seed layer 11 is formed, of the base substrate 10, as shown in FIG. 9B.

In some embodiments, a material of the blocking dam generally is an organic material, and a height of the blocking dam with respect to the surface of the seed layer 11 generally is greater than a target thickness of the to-be-formed first metal layer so as to ensure that a height of the electroplated first metal layer does not exceed the height of the blocking dam.

Figure 9C:
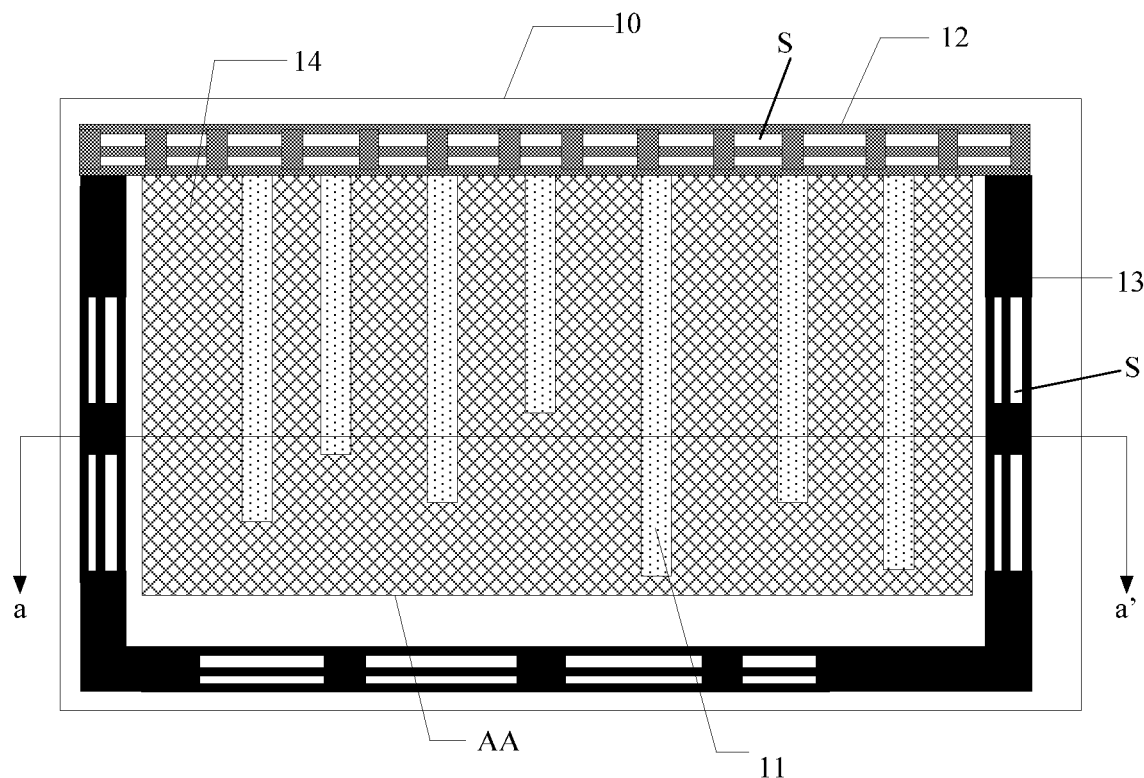
FIG. 9C is a structural schematic diagram obtained after operation S203 is executed in a method for preparing an array substrate provided by an embodiment of the present disclosure.
Figure 9D:
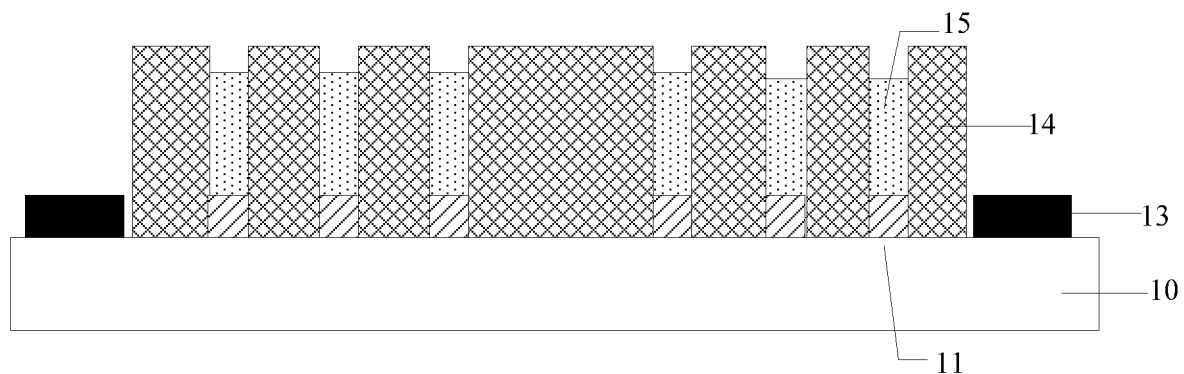
FIG. 9D is a sectional structural schematic diagram in an aa' direction of FIG. 9C.

S203: the pattern of the first metal layer 15 is electroplated on the pattern of the seed layer 11, as shown in FIG. 9C and FIG. 9D.

In some embodiments, the greater a width of the lead electrode is, the larger an electroplated region expanded out of the wiring region is, so that it is more beneficial to uniform distribution of the electric field lines in the wiring region. However, the greater the width of the lead electrode is, the larger an area occupied by the lead electrode is, and the large area occupied by the lead electrode may influence a subsequent production process, e.g., a chemical vapor deposition process and the like.

Therefore, in some embodiments, in the method provided by embodiments of the present disclosure, as shown in FIG. 9A, the lead electrode 12 is provided with a plurality of hollow regions S, so that an overall width of the lead electrode 12 can be as great as possible; and meanwhile, the lead electrode 12 is provided with the plurality of hollow regions S, and thus, the occupied area of the lead electrode 12 is reduced by utilizing the hollow regions S so as to avoid a case that the large area occupied by the lead electrode 12 may influence the subsequent production process.

On the basis of the same reasons with the lead electrode, in some embodiments, in the method provided by embodiments of the present disclosure, as shown in FIG. 9A, the compensation electrode wire 13 is provided with a plurality of hollow regions, so that an overall width of the compensation electrode wire 13 can be as great as possible; and meanwhile, the compensation electrode wire 13 is provided with the plurality of hollow regions S, and thus, the occupied area of the compensation electrode wire 13 is reduced by utilizing the hollow regions S so as to avoid a case that the large area occupied by the compensation electrode wire 13 may influence the subsequent production process.

In some embodiments, a shape of the hollow region may be a regular shape, or may be an irregular shape, and is not limited herein. For example, the shape of the hollow region is round, rectangle, rhombus and the like.

In some embodiments, as long as a large-thickness electrode wire needs to be prepared, the preparation method provided by embodiments of the present disclosure can be adopted. In other words, the array substrate formed by the preparation method provided by the embodiments of the present disclosure can be applied to any product which requires the electrode wire.

Therefore, in some embodiments, when the array substrate is applied to a backlight module, the preparation method provided by embodiments of the present disclosure, after the pattern of the first metal layer is electroplated on the pattern of the seed layer, further includes the following operations.

Figure 10:
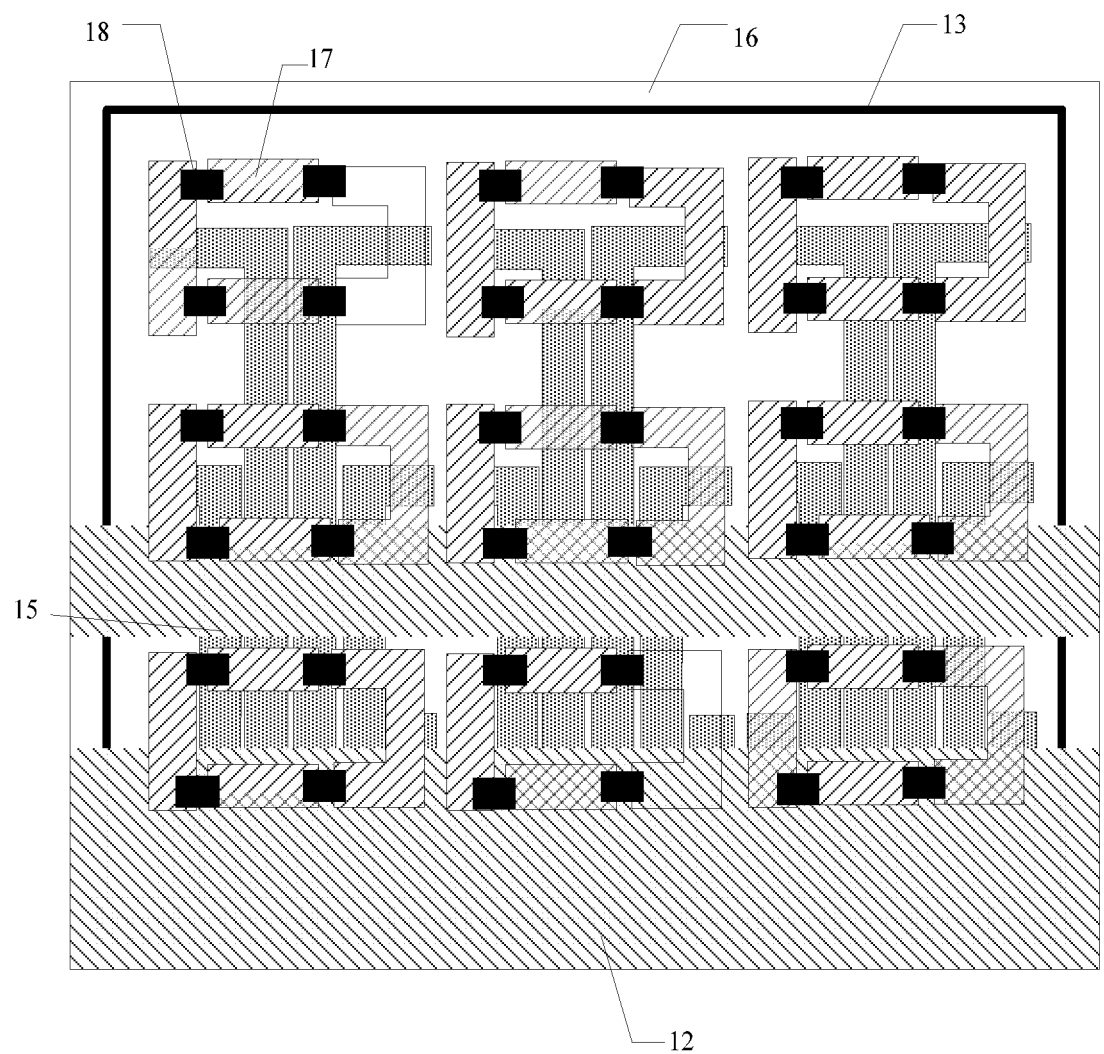
FIG. 10 is a structural schematic diagram of an array substrate prepared by a method provided by an embodiment of the present disclosure.

As shown in FIG. 10, a planarization layer 16 covering the first metal layer 15 is formed.

A pattern of a connection wire 17 is formed on the planarization layer 16.

An array of LEDs 18 is formed on the connection wire 17, and N electrodes and P electrodes of the LEDs 18 are respectively and electrically connected with the first metal layer 15 by the connection wire 17.

In some embodiments, both the compensation electrode wire and the lead electrode are arranged for electroplating the first metal layer, generally cannot be used in later use of the array substrate, and may influence normal use of the array substrate. Therefore, in some embodiments, the preparation method provided by embodiments of the present disclosure, after the array of the LEDs is bound, further includes the following operation.

That is, the compensation electrode wire and the lead electrode are removed.

In some embodiments, after the array of the LEDs is bound, only the wiring region of the array substrate is reserved, and the edge regions around the wiring region generally need to be cut off, and thus, the compensation electrode wire and the lead electrode can be removed in a cutting process.

It should be illustrated that in the preparation method provided by the embodiments of the present disclosure, there may be one wiring region on the base substrate, or there may be a plurality of wiring regions on the base substrate. The above-mentioned embodiments provided by the present disclosure are all illustrated by taking the case that there is one wiring region as an example, and for the case that there are a plurality of wiring regions, the preparation process of each wiring region is the same with the above-mentioned preparation process and is not repeated herein.

In some embodiments, when there are a plurality of wiring regions on the base substrate, the wiring regions need to be cut later, so that each wiring region can be independently used, and thus, the compensation electrode wire and the lead electrode can be removed when the cutting process is carried out.

On the basis of the same inventive concept, embodiments of the present disclosure further provide an array substrate. The array substrate is prepared by adopting the above-mentioned preparation method provided by the embodiments of the present disclosure. The problem solving principle of the array substrate is similar with that of the above-mentioned preparation method of the array substrate, and thus, implementation of the array substrate can refer to implementation of the above-mentioned preparation method, and is not repeated herein.

On the basis of the same inventive concept, embodiments of the present disclosure further provide a backlight module, including a backlight driving circuit and the array substrate provided by the embodiments of the present disclosure. The problem solving principle of the backlight module is similar with that of the above-mentioned array substrate, and thus, implementation of the backlight module can refer to implementation of the above-mentioned array substrate, and is not repeated herein.

According to the array substrate, the method for preparing the array substrate, and the backlight module which are provided by the embodiments of the present disclosure, before the first metal layer is electroplated on the pattern of the seed layer, the method further includes: the pattern of the compensation electrode wire electrically connected with the lead electrode is formed on one side, where the lead electrode is formed, of the base substrate. The compensation electrode wire is at least positioned at the second side of the wiring region, and the first side and the second side are positioned on different sides of the wiring region. In the electroplating process, the lead electrode is connected with the negative pole of the power supply; and the compensation electrode wire is electrically connected with the lead electrode, and thus, the area of the electroplating negative pole generating the electric field lines is increased by utilizing the compensation electrode wire, and the uniform electric field lines at the edge of the wiring region are increased to expand the edge region of electroplating out of the wiring region so as to improve distribution of the electric field lines in the wiring region and improve electroplating uniformity.

It is evident that one person skilled in the art can make various changes or modifications to the present disclosure without departure from the spirit and scope of the present disclosure. Thus, if these changes and modifications to the present disclosure are within the scope of the claims of the present disclosure and equivalent technologies, the present disclosure also intends to include all such changes and modifications within its scope.

What is claimed is:

1. A method for preparing an array substrate, comprising:
    forming a pattern of a seed layer in a wiring region of a base substrate;
    forming a pattern of a lead electrode at a first side of the wiring region, the lead electrode being electrically connected with the seed layer;
    forming a pattern of a blocking dam on a side, where the pattern of the seed layer is formed, of the base substrate, the pattern of the seed layer being complementary with the pattern of the blocking dam; and
    electroplating a pattern of a first metal layer on the pattern of the seed layer, and when electroplating the pattern of the first metal layer, connecting the lead electrode with a negative pole of a power supply;
    wherein before said electroplating the pattern of the first metal layer on the pattern of the seed layer, the method further comprises:
        forming a pattern of a compensation electrode wire electrically connected with the lead electrode on a side, where the lead electrode is formed, of the base substrate;
        wherein the compensation electrode wire is at least at a second side of the wiring region, and the first side and the second side are different sides of the wiring region.

2. The method according to claim 1, wherein:
    the pattern of the seed layer and the pattern of the lead electrode are formed by adopting a one-time patterning process; or
    the pattern of the compensation electrode wire is formed when the pattern of the seed layer is formed; or
    the pattern of the compensation electrode wire is formed when the pattern of the lead electrode is formed.

3. The method according to claim 1, wherein the lead electrode is provided with a plurality of hollow regions.

4. The method according to claim 1, wherein the compensation electrode wire and the lead electrode are distributed in a mode of surrounding the wiring region.

5. The method according to claim 1, wherein the compensation electrode wire is provided with a plurality of hollow regions.

6. (Original The method according to claim 1, wherein at least a material of a surface of the seed layer is same as a material of the first metal layer.

7. The method according to claim 1, wherein a material of the first metal layer is copper.

8. The method according to claim 7, wherein the seed layer comprises:
    molybdenum and copper located sequentially on the base substrate; or
    molybdenum alloy and copper located sequentially on the base substrate; or
    titanium and copper located sequentially on the base substrate.

9. The method according to claim 1, wherein after said electroplating the pattern of the first metal layer on the pattern of the seed layer, the method further comprises:
    forming a planarization layer covering the pattern of the first metal layer;
    forming a pattern of a connection wire on the planarization layer; and
    binding an array of Light-Emitting Diodes (LEDs) on the connection wire, and electrically connecting the LEDs with the first metal layer by the connection wire.

10. The method according to claim 9, wherein after said binding the array of the LEDs, the method further comprises:
    removing the pattern of the compensation electrode wire and the pattern of the lead electrode.

11. An array substrate, prepared by adopting the method according to 10 claim 1.

12. A backlight module, comprising a backlight driving circuit and the array substrate according to claim 11.

* * * * *